United States Patent [19]
Buchoff et al.

[11] 3,971,610
[45] July 27, 1976

[54] CONDUCTIVE ELASTOMERIC CONTACTS AND CONNECTORS

[75] Inventors: Leonard S. Buchoff, Bloomfield; Joseph P. Kosiarski, Englishtown; Chris A. Dalamangas, Fort Lee, all of N.J.

[73] Assignee: Technical Wire Products, Inc., Cranford, N.J.

[22] Filed: May 10, 1974

[21] Appl. No.: 468,652

[52] U.S. Cl. .............................. 339/17 R; 174/68.5; 339/DIG. 3
[51] Int. Cl.² ......................................... H05K 1/04
[58] Field of Search ............ 339/17 LC, 17 R, 17 C, 339/DIG. 3, 18 C; 174/68.5; 338/94, 100, 114

[56] References Cited
UNITED STATES PATENTS

| | | | |
|---|---|---|---|
| 3,503,031 | 3/1970 | Nyaus et al. ........................ | 338/99 |
| 3,601,523 | 8/1971 | Arndt ................................. | 174/68.5 |
| 3,680,037 | 7/1972 | Nellis et al. ....................... | 339/18 C X |

OTHER PUBLICATIONS

Solderless Electrical Contacts, L. F. Miller and A. H. Mones, IBM Technical Disclosure Bulletin, vol. 7, No. 1, pp. 101–102, June 1964.

*Primary Examiner*—Roy Lake
*Assistant Examiner*—E. F. Desmond
*Attorney, Agent, or Firm*—Littlepage, Quaintance, Murphy & Dobyns

[57] ABSTRACT

Contacts of electrically conductive elastomers, integrally fixed to conductors by bonding or molding in place, are situated to contact, with little resistance, mating electrical conductors and elastically deform under the contacting forces to seal the mated conductor surface thereby inhibiting corrosion and maintaining electrical contact.

9 Claims, 13 Drawing Figures

CONDUCTIVE ELASTOMERIC CONTACTS AND CONNECTORS

BACKGROUND OF THE INVENTION

1. Field of the Invention

This invention pertains to electrical contacts and connectors made of metal-filled or carbon-filled resilient elastomers molded on or bonded to electrically conductive substrates and particularly to electrical connectors having a plurality of elastomeric contacts in a predetermined arrangement.

2. Description of the Prior Art

Electrical connectors having mechanical metal contacts which mate in some fashion to provide a continuous electrical path often provide for some relative motion between the mating contacts to effect the wiping action, thus ensuring proper connection. Where a plurality of such contacts are positioned in an electrically insulative holder or frame of sorts, some relative motion between the contacts is also generally provided to ensure proper alignment with the mating contacts. If a large number of contacts are so situated in a single holder or frame for simultaneous contact or where repeated making and breaking of the contacts is experienced, misalignment, wear, bending, shorting and other types of circuit failure are commonly experienced. Metal contacts have the additional difficulties of being generally difficult to reproduceably fabricate and subject to fatigue when under continuous use.

Any wiping action abrades the contact surfaces by removing plating and damaging soft conductors such as indium oxide and tin oxide. Metal-pressure contacts often become misaligned due to shock and vibration.

Where a permanent or semipermanent electrical connection is desired, but where soldering is impossible or undesirable, metal to metal contacts experience surface abrasion due to the wiping action of the initial contact which in time is subject to corrosion and increased contact resistance. The actual contacting area of a metal to metal contact is typically less than one-thousandth of the total surface area of the metal contact. Moisture or other hostile atmosphere can then migrate between the contact surfaces and rapidly deteriorate the quality of the metallic joint.

To overcome these problems, interconnector frames carrying conductive elastomeric contacts have been proposed to interface between two conductors or terminals. Examples are to be found in U.S. Pat. Nos. 3,648,002 and 3,680,037. The interconnectors add additional weight, take up usable space and increase lead length and circuit resistance. Another patent of general interest in this area is U.S. Pat. No. 3,509,296.

The composition of conductive elastomers which can be used in contacts according to this invention may be found in U.S. Pat. Nos. 3,140,342; 3,412,043 and 3,609,104, as well as others.

SUMMARY OF THE INVENTION

A contact of a conductive elastomer, integrally fixed to a first conductor or conductive substrate by bonding or molding in place, is situated to contact an opposing or mating electrical conductor under the influence of an externally applied force. The conductive elastomer "elastically deforms" under the influence of the external force, sealing the contacted surface of the mating conductor against encroachment of liquids or gases thereby inhibiting or preventing corrosion. When salt spray tests have been performed on the elastomeric contacts herein described, the areas of the conductor beyond the elastomeric contact experienced corrosion while the area under the contact shielded from the salt spray showed negligible deterioration.

The elastomeric contacts can be precisely molded into any desired configuration with a high degree of reproducability. The hardness, shape and so forth of the contact can be tailored to produce a wide variety of electrical and mechanical characteristics. Current density of 20 amperes per square centimeter can be achieved with the correct choice of material and design. Connectors can be as thin as 0.2 mm. and center-to-center distances of less than 1.0 mm. are possible.

No soldering or other heat producing processes are needed to bond the elastomeric contacts to the conductors, and therefore, heat sensitive components can be safely attached in this manner. Since the contacts and the conductors upon which the contacts are integrally fixed do not have to be solderable, difficultly solderable materials such as nickel, cadmium, stainless steel, conductive plastics, conductive coatings and tin oxide can be used directly with no preliminary treatment. The conductive fillers dispersed in the elastomeric contact produce little or no significant corrosion on the conductor surfaces due to galvanic action.

The elastomeric contacts herein described are particularly adapted to the rapid assembly of electronic packages, circuit boards and the like into larger systems since continuity is established by merely clamping the mating surfaces together. Automatic assembly is simplified because a degree of misalignment in the contact pads can be tolerated. Electronic packages having a multitude of contacts can be produced at very low cost and at high volumes, since the costs do not rise as rapidly as the complexity of the configuration of the contacts or their number increases.

Likewise, the disassembly of the unit and replacement of the parts is easy, fast and virtually foolproof. Inexpensive subassemblies can be recovered without damaging them or other components in the vicinity. The elasticity of the connectors allows for non-parallelism in the mating boards while lead straightening and positioning are virtually eliminated.

Whole circuit boards can be solder dipped to ensure continuity even after the elastomeric contacts are attached, as the contacts are not wetted or deteriorated by the solder. The molded elastomeric contacts can be used to tie double-sided circuit boards together, eliminating the need for plated-through holes. Extra components can be added after soldering without loosening the previously made joints.

Other features and advantages of the elastomeric contacts herein described will become apparent from the following description of preferred embodiments, figures and claims.

DESCRIPTION OF PREFERRED EMBODIMENTS

Figure 1:
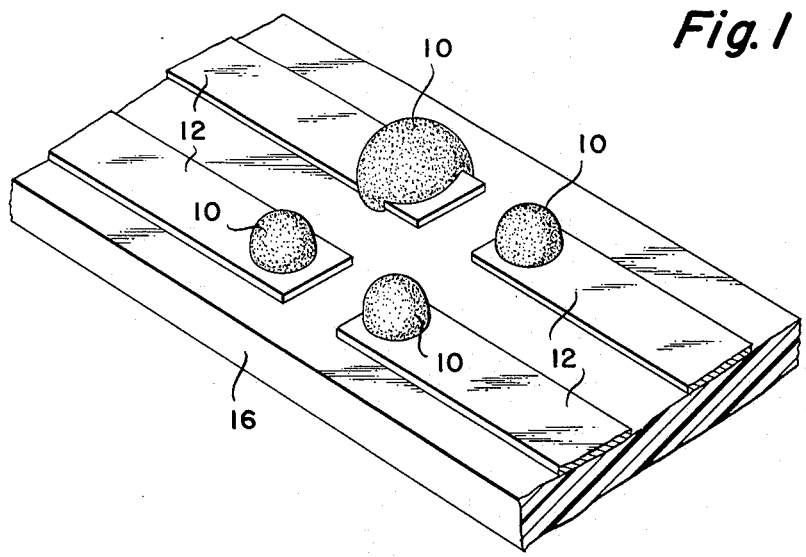
FIG. 1 is a perspective view of conductors on a circuit board with elastomeric contacts of this invention fixed to the conductors.

Electrical contacts and connectors made of resilient elastomers incorporating a carbon or metallic filler can be molded on or bonded to electrical conductors and adapted to serve as terminals, switches, probes and the like. While elastomers such as polyurethane, plasticized vinyl, neoprene, butyl rubber and EPDM, can be used in specific applications, the preferred elastomer is silicone rubber. Silicone rubber has low compression set, is operable over a wide temperature range (typically −75° to +200°C) is resistant to most environments, and is stable on aging.

The choice of conductive filler will depend on the resistance required, temperature range experienced, environments, mating materials, and the physical properties such as compression set and strength. For contacts having a resistivity in the range of 1–5,000 ohm-cm., the conductive particle to be incorporated in the elastomer is generally carbon. Carbon-filled compounds have the highest strength, the greatest range of hardness, and are easiest to mold. Carbon has the additional advantage of being the least expensive conductive filler.

For the lowest resistivities, down to fractions of a milliohm-cm., silver is the preferred filler. It is used in various sizes and configurations such as powder, fibers, chopped wire and flakes having a wide range of aspect ratios and sizes. Silver can also be coated onto glass beads, copper powder and a variety of other metallic and non-metallic substrates to produce less expensive fillers.

An example of such a compromise is silver plated copper. This material has the conductivity of pure silver, but at a fraction of the cost. Unfortunately, it cannot be used for long times above 120°C, as the copper will migrate through the silver and oxidize, thus causing a loss of conductivity. The optimum balance of properties is obtained for each application by choosing the correct combination of conductive and non-conductive fillers.

For intermediate conductivities and in areas where silver might not be compatible with other materials in the system, but where corrosion resistance is necessary, nickel can be used as a filler. Other metals such as tin, zinc, gold, conductive oxides and combinations of these have been tried as conductive fillers in elastomers with varying success.

Typically an elastomer does not become conductive at metal loadings below 1.5 volume percent while the maximum necessary loading is 50 volume percent. The proportion by weight of metal filler is dependent upon the specific gravity of the particular metal and elastomer concerned and may also depend on the particular size and shape of metal filler. It is generally thought that there must be particle to particle contact to transmit electricity through the body of the elastomer. It has been observed that in general the thermal conductivity of the elastomer is increased by a factor of 5 to 10 by the addition of sufficient metallic fillers. The order and method of incorporation of the various fillers used, mold design, storage time, fabrication technique, temperature and time of cure, temperature and time of post-cure, can all have dramatic effects on the conductivity of the finished elastomeric contact.

A typical electronic package shown in FIG. 1 generally as 14 consists of a printed circuit board 16 conventionally made of a laminate such as an epoxy-glass cloth or a phenolic-paper. The circuit board 16 has at least one and typically a plurality of conductors 12 fixed to a surface thereof. Conductive elastomeric contacts 10 are integrally fixed to the conductors 12 by either bonding the contact buttons 10 to the conductors with an electrically conductive cement for adhesive, or by molding the contact buttons in position directly on the electronic package. The choice of materials of the circuit board 16 may in part depend upon whether the contacts are to be bonded or molded, and if molded, the temperatures and times of cure and post-cure necessary for the particular conductive elastomer.

Figure 2:
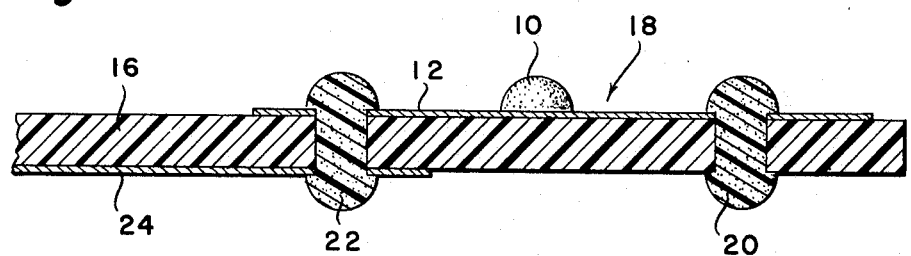
FIG. 2 is a sectional detail showing a circuit board with contacts according to this invention.

The elastomeric contacts are useful for connecting conductors on opposite sides of a circuit board, as shown in FIG. 2. A circuit board 16 carrying a conductor 12 on at least a portion of a surface of the board can have bonded, molded, or otherwise integrally fixed to a surface 18 of the conductor 12 an elastomeric contact button 10. The elastomeric contact may be given greater strength by integrally fixing a contact, such as 20, through a penetration of the conductor 12 and the circuit board 16. This is particularly advantageous where the conductive elastomeric contact is to be subjected to tangential or other motion which may cause shearing forces to develop. Where it is not feasible that the button be designed to penetrate the circuit board, the same advantage can be obtained by designing the button to cover both the conductor and some of the surrounding nonconductive area to increase the adhesion of the contact button to the electronic package assembly.

A conductive elastomeric contact such as 22 is useful for connecting conductors on opposite sides of a single circuit board, thus replacing the conventional plated-through holes in a circuit board which has often proved to be unreliable as a result of differential thermal expansion between the plating and the substrate or imperfect plating. The contact 22 penetrates the circuit board 16 and the two opposite conductors 12 and 24 and is integrally fixed to at least one of the conductors.

Figure 3:
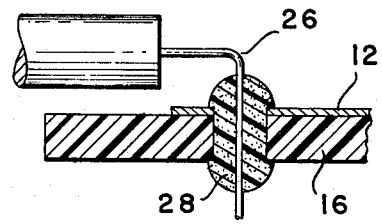
FIG. 3 is a sectional detail of an apertured contact according to this invention with an electrical conductor in the aperture.

The contact 20 or 22 of FIG. 2 can be modified or made to receive a lead 26, as shown in FIG. 3. The contact 28 can either be sufficiently penetrable or apertured to receive the conductor 26, essentially coaxially with that portion of the contact penetrating the circuit board. Contacts, or sockets, such as 28 can be advantageously used in connection with "bread boarding" and temporary testing circuits, as well as in finished "assembly line" construction. No pretreatment except cleaning of the conductor 26 is necessary to achieve satisfactory low contact resistance.

Figure 4:
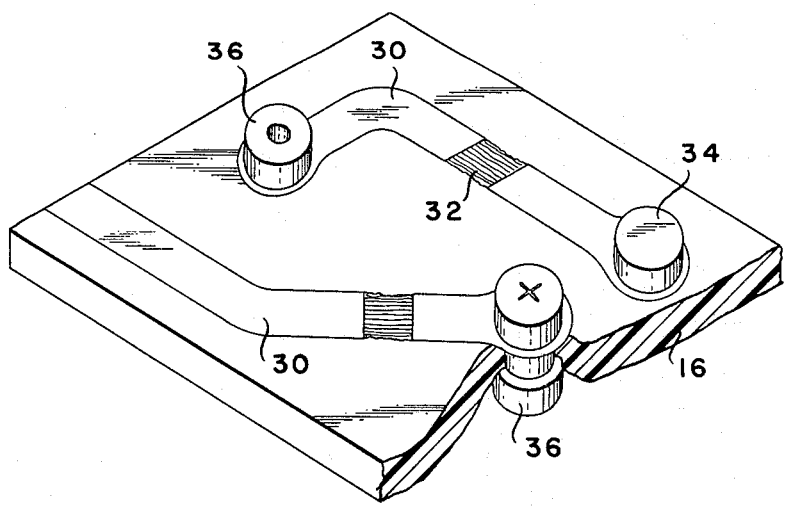
FIG. 4 is a perspective detail of a circuit board with apertured and non-apertured contacts.

Conductive paths 30 and resistive paths 32 can be screened onto a printed circuit board 16, as shown in FIG. 4. The conductive elastomeric contact buttons 34 and apertured contact buttons 36 can then be affixed to the conductive paths or molded through appropriate holes in the conductive path and supporting circuit board. The conductive button can be designed to also introduce an appropriate contact resistance, if desired, to match the requirements of the circuit.

Figure 5:
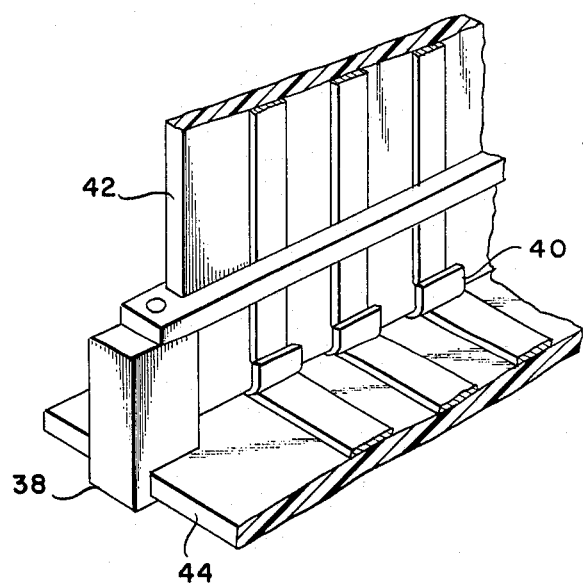
FIG. 5 is a perspective view of contacts according to this invention used on the end of a printed circuit.

Conductive elastomeric contacts can also be used as edge connectors for printed circuit boards, liquid crystal displays, flat etched cable, etc., as in FIG. 5. It is particularly advantageous to use the screw or snap-in type retaining mechanism or other means 38 for maintaining the physical proximity between the two members to be joined in this fashion. The conductive contacts 40 can be fixed to either the edge of the board 42 or the surface of the board 44. In either instance, the contacts are integrally fixed to the conductors of the first board and are adapted to abut the conductors of a second mating board in such a manner as to electrically connect the conductors of the first and second board.

One of the two mating boards can be replaced by a housing containing an integrated circuit, capacitors, coils, or other appropriate subassemblies. In the case of integrated circuits, conductive elastomeric contacts can also be molded on or otherwise integrally fixed to the wire ends projecting from a conventional integrated circuit protective case.

Figure 6:
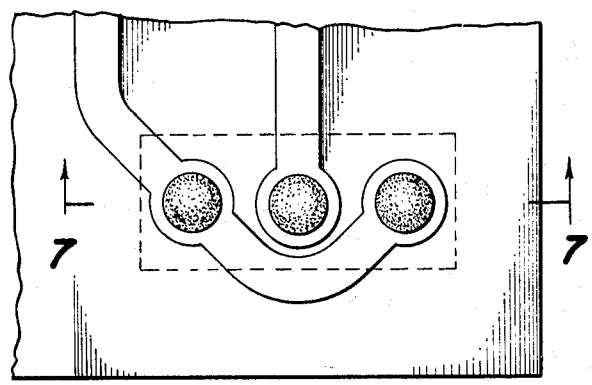
FIG. 6 is a plan view of a button switch using contacts according to this invention.
Figure 7:
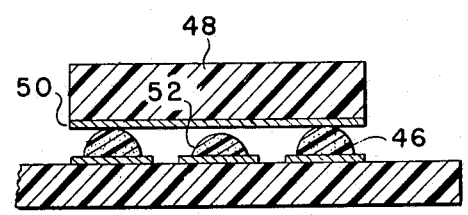
FIG. 7 is a sectional view of the button switch of FIG. 6 cut along line 7—7.

The conductive elastomeric contacts can be used to make a switch as shown in FIGS. 6 and 7, wherein the elastomeric buttons 46 will serve both as the compliant contacts for the actuator 48 and as the elastic member of the switch holding the actuator 48 in position. The actuator need only have a conductive surface 50 to complete the circuit between elastomeric contacts 46 and a third elastomeric contact 52. The compliant contacts 46 can be designed to produce a wide range of closing forces. Switches have been made using this concept, wherein the total button height before compression was in the neighborhood of 0.7mm and the buttons were depressed a distance of from 0.1 to 0.4 mm. This is not to be viewed as the complete range of operability, but rather a typical situation employing the buttons as the elastic member of the switch as well as the contact for the switch. Different compliance situations will require that the buttons have different stress relaxation as a function of time, strain, composition and shape.

The button shape and height is generally dictated by the function which the button will serve, the modulus of the elastomer, the number of buttons making simultaneous contacts, the required substrate flatness, the conductivity required, and the force available to make contact. It will be appreciated that a great variety of contact button shapes are available, including round, semi-cylindrical, square and concentric circular, as well as parallelepiped and truncated pyramids.

Figure 8A:
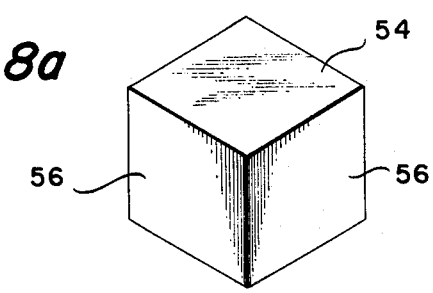
FIGS. 8a and b are diagrammatic representations of a unit cube and a unit cylinder, respectively.

In order to be able to design the elastomeric contacts for optimum utility, several variables, such as shape factor, must be taken into account. Shape factor is the ratio of the area of the loaded surface to the total area of the unloaded surface free to expand. FIG. 8a shows an elastomer in the shape of a cube with the length of each edge being a unit dimension. The area of the surface to be loaded 54 is then equal to the unit dimension squared. The total area of the surfaces which are free to expand 56 is equal to four times the unit dimension squared. Thus, the shape factor for a cube is 0.25, that is, the area of surface 54 divided by the total area of surfaces 56.

Figure 8B:
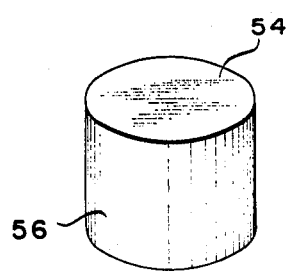

FIG. 8b shows a cylindrical shape having a height of the same unit length and an area for the surface to be loaded, 54, equal to one unit squared, which is the same as in FIG. 8a. If surface 54 of FIG. 8b has an area of one unit squared, then the radius of surface 54 must be approximately 0.564. The area 56, which is free to expand under a load, is then equal to 3.54 units square and the cylinder has a shape factor of 0.282.

Figure 9A:
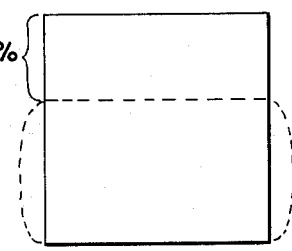
FIG. 9a and b are diagrammatic representations of the compression experiences by the unit elements of FIGS. 8a and b respectively.
Figure 9B:
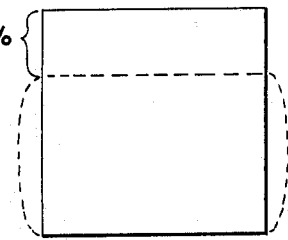

FIGS. 9a and 9b diagrammatically represent the elastomers of FIG. 8a and 8b, respectively, when placed under a load of 1,000 psi. It is noted that the elastomer having the larger surface area in which to expand, that is a smaller shape factor, will experience a greater compression under the same load conditions.

Figure 10:
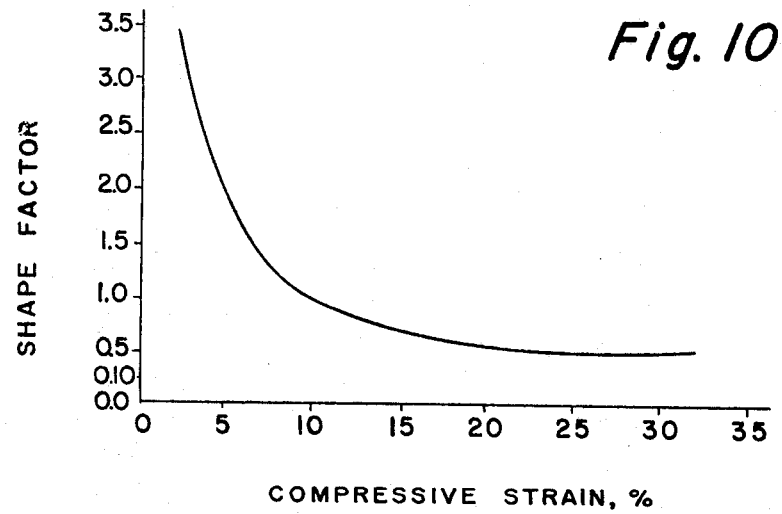
FIG. 10 is an empirical curve of compressive strain as a function of shape factor for a fixed stress.

FIG. 10 is a graph showing the compressive strain, that is, the deflection experienced expressed as a percent, as a function of the shape factor. This curve was achieved by examining the compression characteristics for a DuPont polyurethane elastomer having a shore A hardness of 60 under a pressure of 200 psi. It will be noted that as the shape factor decreases, the compressive strain increases; that is, as the ratio of free area to expand 56 to load area 54 increases, the compressive strain also increases, but not in a linear fashion. Curves for conductive elastomers are similar in shape, but not identical. If the physical dimension of a particular elastomeric contact are set by other considerations, such as travel space, or available compressive force, then changes in button characteristics can be achieved by the selection of differing elastomers. If, on the other hand, the choice of elastomers is set by reason of availability of materials or curing temperature considerations, proper operating characteristics may be achieved by modifying the button shape to achieve the proper shape factor.

Figure 11:
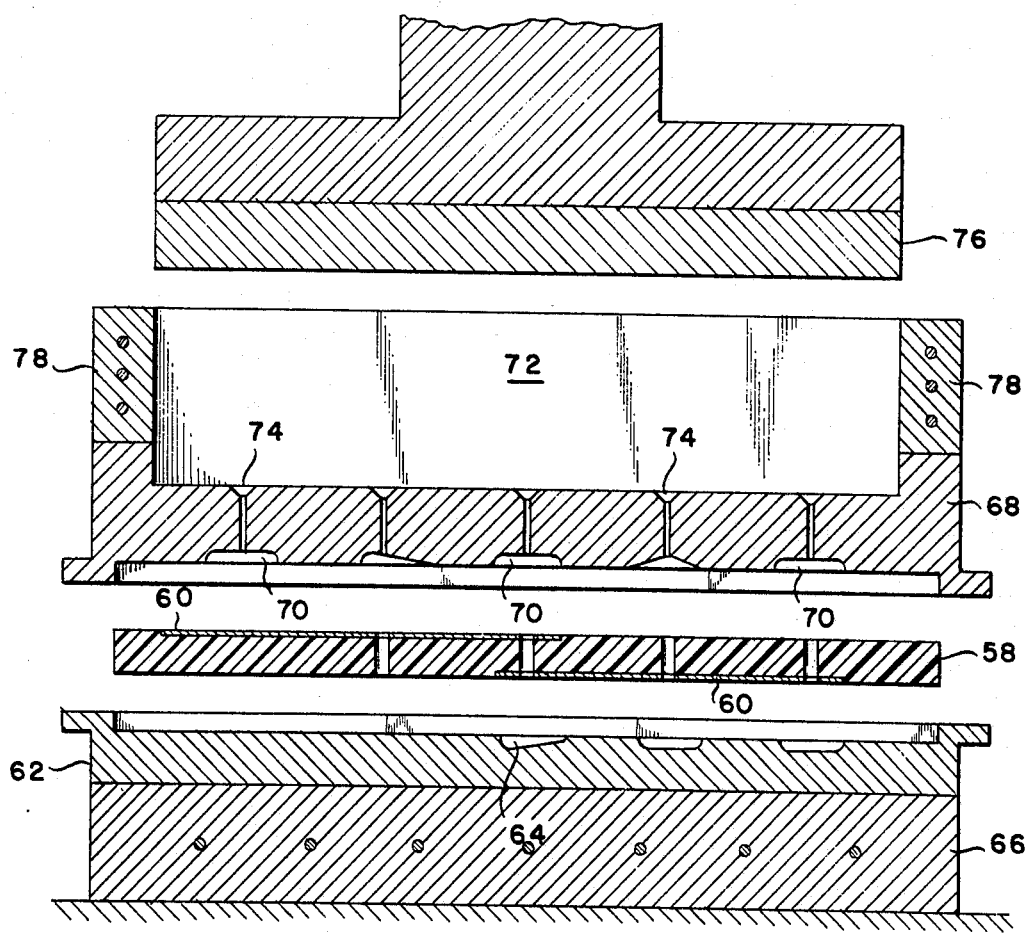
FIG. 11 is a diagrammatic representation of a means for making the contacts according to this invention.

FIG. 11 diagrammatically depicts an apparatus for transfer molding the elastomeric contacts onto an electronic assembly circuit board or other substrate 58, which may generally be carrying a plurality of electric conductors 60 as well as other electronic components. The transfer molding apparatus consists of a base template 62 and a transfer template 68, each having appropriate depressions 64 and 70, respectively, for defining an elastomeric contact surface. The base template 62 and transfer template 68 together form a mold cavity in which the substrate 58 is positioned. The transfer template 68 also consists of a charging chamber 72 for receiving the charge of elastomer previous to molding and communicating channels 74 between the charging chambers 72 and depressions 70 for permitting the elastomers to be transferred. Ram 76 snuggly seals the charging chamber 72 for exerting the proper pressure on the elastomeric charge to plasticize and force the elastomer through the channels 74. A means for heating the upper template and elastomeric charge is located in the upper template 68. Means 66 for heating the lower template and for assisting in curing the elastomer when transferred is positioned below the lower template.

In operation, a circuit or other substrate 58 is positioned within the mold cavity formed by the upper template 68 and lower template 62 and the two templates joined together securing the substrate 58 in position. A charge of conductive elastomer is placed in the charging cavity 72, heating means 66 and heating means 78 are then brought to the appropriate temperature. Ram 76 is then forced into the charging chamber or transfer pot 72, transferring the elastomer from the transfer chamber through the channels 74 and into the contact area formed between the depression surfaces 64 and 70 the substrate 58. The heating means 66 and 78 continue heating while the pressure on the ram remains at a prefixed amount for curing the elastomer in place in the circuit board. The pressure on the ram 76 is then released, the mold cavity taken apart, and the circuit board with elastomeric contacts removed from the mold cavity.

The following is an example of the production of an electronic package having silver-filled silicone buttons molded onto the leads of the package. The compound used was:

TABLE 1

| Material | Weight |
| --- | --- |
| Silicone rubber compound Devolatilized methyl vinyl polysiloxane gum containing reforcing fillers, processing aids and stabilizing agents (Rhodia Corp. Compound RE-650) | 19.8% |
| Dicumyl peroxide carried on carrier of precipitated calcium carbonate, 40% active (Hercules, Inc., Di-Cup 40C) | 0.2% |
| Silver coated copper powder 6% by weight Silver on copper powder Particle size, 10–50 microns (Boronite Corp. Silvered Copper 5315) | 65.0% |
| Silver powder Average particle diameter 3.0–4.0 microns Apparent density 16–19 gms/in$^3$ (Metz Metallurgical Corp., EG-200) | 5.0% |
| Silver flake Average particle diameter 10.0 microns Average particle thickness 1.5 microns Apparent density 20–27 gms/in$^3$ (Metz Metallurgical Corp., Ag Flake No. 6) | 10.0% |

An electronic package was positioned in the appropriate mold cavity and the mold assembled. The molding compound listed above was placed in the transfer pot. The material was transferred and cured at a pressure of 20,000 psi, and at a temperature of 340°C. for 10 minutes. The cull was removed, the mold opened and the assembly removed. Twenty-four conductive rubber buttons had been formed on the 24 copper lead ends with a resistance of less than 1 ohm from each button to the internal wiring.

What is claimed is:

1. A circuit board carrying at least two conductors on a portion of one side of said board, said at least two conductors being electrically insulated from each other, each conductor having an electrically conductive elastomeric contact integrally fixed thereto, and actuator means positioned in physical proximity to at least two of said elastomeric contacts, the actuator means having a conductive surface for completing the electrical circuit between said at least two elastomeric contacts, at least one of said elastomeric contacts extending from the surface of said circuit board to said actuator means for preventing the conductive surface of said actuator means from contacting another elastomeric contact on said board without the application of an externally applied force.

2. The electrical connector of claim 1 wherein each said conductive elastomeric contact is molded to the surface of each said conductor.

3. The electrical connector of claim 1 wherein each said conductive elastomeric contact is adhesively bonded to a surface of each said conductor.

4. An electrical connector according to claim 1 wherein each conductive elastomeric contact penetrates a portion of each said conductor.

5. An electrical connector according to claim 1 wherein each said conductive elastomeric contact penetrates each said conductor and said circuit board.

6. The apparatus of claim 1 wherein at least one of said electrically conductive elastomeric contact is fixed to an edge of said circuit board.

7. The apparatus of claim 1 wherein each said electrically conducted elastomeric contact has a shape factor between 0.10 and 10.0.

8. A first circuit board carrying at least one conductor on a portion of one side of said board, said conductor extending to an edge of said board, an electrically conductive elastomeric contact integrally fixed to said conductor at the edge of said circuit board, a second circuit board carrying at least one conductor on a portion of one side of said second board, and means for maintaining the physical proximity of said first and second circuit boards such that said electrically conductive elastomeric contact touches at least one conductor of said second circuit board.

9. The apparatus of claim 8 wherein each said electrically conductive elastomeric contact has a shape factor between 0.10 and 10.0.

* * * * *